(12) United States Patent
Lin et al.

(10) Patent No.: US 9,996,011 B2
(45) Date of Patent: *Jun. 12, 2018

(54) SYSTEM AND METHOD FOR LITHOGRAPHY ALIGNMENT

(71) Applicant: Taiwan Semiconductor Manufacturing Company, Ltd., Hsin-Chu (TW)

(72) Inventors: Yu-Hsien Lin, Hsinchu (TW); Hung-Chang Hsieh, Hsinchu (TW); Feng-Jia Shiu, Hsinchu County (TW); Chun-Yi Lee, Hsinchu County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 79 days.

This patent is subject to a terminal disclaimer.

(21) Appl. No.: 15/090,108

(22) Filed: Apr. 4, 2016

(65) Prior Publication Data

US 2016/0216613 A1 Jul. 28, 2016

Related U.S. Application Data

(63) Continuation of application No. 13/732,913, filed on Jan. 2, 2013, now Pat. No. 9,304,403.

(51) Int. Cl.
*G03B 27/42* (2006.01)
*G03B 27/54* (2006.01)
(Continued)

(52) U.S. Cl.
CPC ........ *G03F 7/70141* (2013.01); *G03F 9/7084* (2013.01)

(58) Field of Classification Search
CPC ............ G03F 7/70141; G03F 7/70633; G03F 7/70666; G03F 7/70675; G03F 7/70616; G03F 7/70683; G03F 7/70775; G03F 7/70191; G03F 7/70575; G03F 7/70025; G03F 7/70691; G03F 7/7085; G03F 7/70991; G03F 9/70; G03F 9/7003;
(Continued)

(56) References Cited

U.S. PATENT DOCUMENTS 4,669,884 A 6/1987 Bigelow et al.
5,276,337 A 1/1994 Starikov
(Continued)

*Primary Examiner* — Christina Riddle
(74) *Attorney, Agent, or Firm* — Haynes and Boone, LLP

(57) ABSTRACT

A method provides an integrated circuit (IC) substrate having first and second alignment marks defined in a first pattern layer, and third and fourth alignment marks defined in a second pattern layer. The first and second alignment marks are illuminated, through a photomask, with a first light to determine a first layer alignment error including a first alignment error and a second alignment error. The first alignment error has more weight than the second alignment error in determining the first layer alignment error. The third and fourth alignment marks are illuminated with a second light to determine a second layer alignment error including a third alignment error in relation to the third alignment mark and a fourth alignment error in relation to the fourth alignment mark. The third alignment error has more weight than the fourth alignment error in determining the second layer alignment error.

20 Claims, 11 Drawing Sheets

(51) Int. Cl.
*G03B 27/32* (2006.01)
*G03F 7/20* (2006.01)
*G03F 9/00* (2006.01)

(58) Field of Classification Search
CPC .... G03F 9/7015; G03F 9/7065; G03F 9/7073; G03F 9/7084; G03F 9/7088; G03F 9/7046; G03F 9/7069
USPC .... 355/52, 53, 55, 67–77; 250/492.1, 492.2, 250/492.22, 548; 356/399–401
See application file for complete search history.

(56) References Cited

U.S. PATENT DOCUMENTS

| | | |
|---|---|---|
| 5,329,354 A | 7/1994 | Yamamoto et al. |
| 5,481,362 A | 1/1996 | Van Den Brink et al. |
| 5,532,091 A | 7/1996 | Mizutani |
| 5,703,685 A | 12/1997 | Senda et al. |
| 5,933,743 A | 8/1999 | New et al. |
| 5,952,135 A | 9/1999 | Ghandehari et al. |
| 6,376,329 B1 | 4/2002 | Sogard et al. |
| 6,768,539 B2 | 7/2004 | Gui et al. |
| 6,834,134 B2 | 12/2004 | Brennan et al. |
| 7,224,446 B2 | 5/2007 | Kreh et al. |
| 7,468,795 B2 | 12/2008 | Simons |
| 7,687,209 B2 | 3/2010 | Schaar et al. |
| 8,508,736 B2 | 8/2013 | Den Boef et al. |
| 8,613,905 B2 | 12/2013 | Blatchford James Walter |
| 8,659,743 B2 | 2/2014 | Mishima |
| 2006/0141374 A1* | 6/2006 | Maria Van Bilsen ........... G03F 9/7003 430/22 |
| 2007/0021860 A1* | 1/2007 | Gertrudus Simons ............... G03F 7/70516 700/121 |
| 2009/0246709 A1* | 10/2009 | Nakasugi ............... B82Y 10/00 430/319 |
| 2010/0245792 A1* | 9/2010 | Bijnen ................... G03B 27/42 355/53 |

* cited by examiner

SYSTEM AND METHOD FOR LITHOGRAPHY ALIGNMENT

CROSS-REFERENCES TO RELATED APPLICATIONS

The present application is a Continuation of U.S. patent application Ser. No. 13/732,913, entitled "SYSTEM AND METHOD FOR LITHOGRAPHY ALIGNMENT," filed Jan. 2, 2013, which is hereby incorporated by reference in its entirety.

BACKGROUND

Semiconductor integrated circuit (IC) fabrication involves forming multiple material layers with designed patterns on a semiconductor wafer. Each layer has to be aligned with previous layers such that the formed circuit can function properly. Various marks are used for this purpose. For example, alignment marks are used for alignment between a photomask and the semiconductor wafer. In another example, overlay marks are used to monitor overlay deviation between the layers on the wafer. As semiconductor technology continues progressing to circuit layouts having smaller feature sizes, the alignment requirement becomes more stringent and the alignment/overlay marks are expected to take less wafer area. However, when a non-planar structure is utilized in the integrated circuit, the existing alignment method and the system is not capable of alignment monitoring and measuring with high accuracy. For example, a three dimensional devices, such as Fin-like field effect transistor (FinFET), is formed on a wafer, the existing alignment system with a single wavelength and the corresponding method are not capable of making proper alignment measurement. Especially, when the patterned structure is thinned down (or polished), the alignment signal is degraded. Accordingly, the wafer quality is degraded due to the misalignment. It is desired, therefore, to provide a method and a system for monitoring and controlling alignment and overlay with high measurement signal quality and (accordingly) high wafer quality.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. Furthermore, all features may not be shown in all drawings for simplicity.

DETAILED DESCRIPTION

The present disclosure relates generally to lithography systems and a method of utilizing such systems. It is understood, however, that the following disclosure provides many different embodiments, or examples, for implementing different features of the invention. Specific examples of components and arrangements are described below to simplify the present disclosure. These are, of course, merely examples and are not intended to be limiting.

Figure 1:
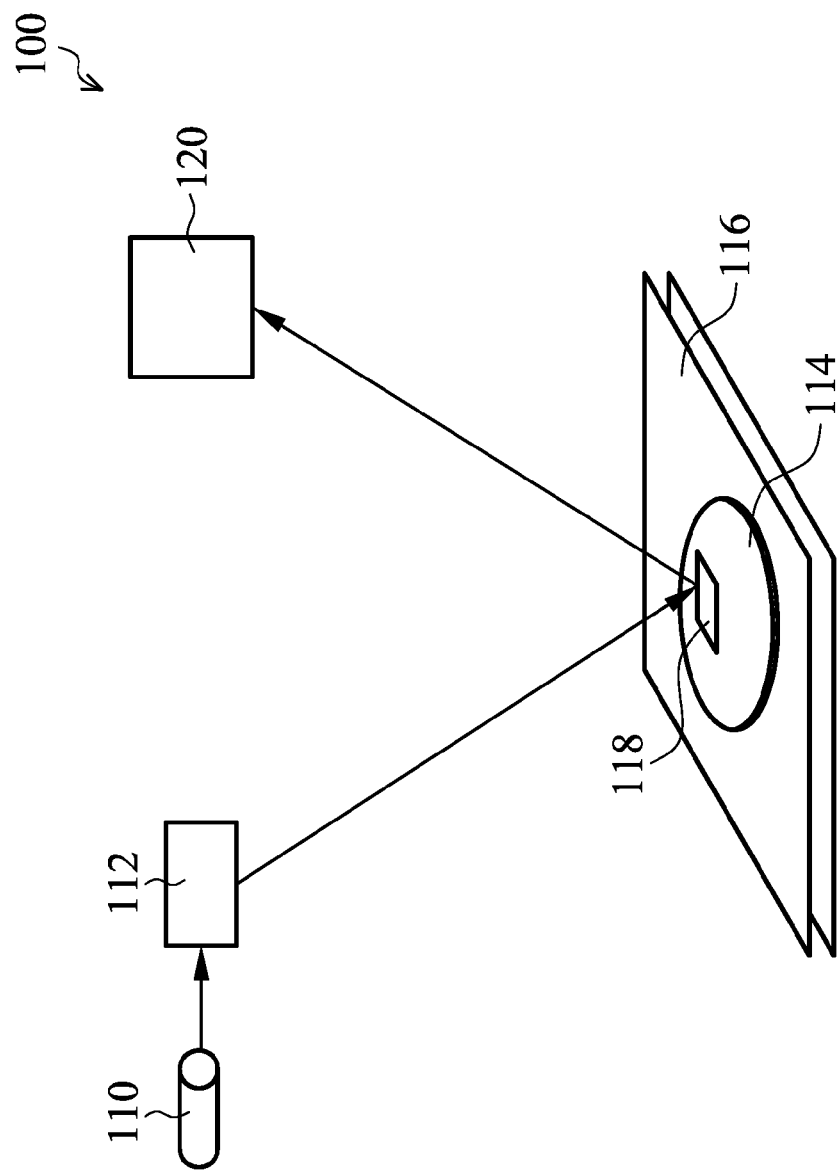
FIG. 1 is a schematic view of one embodiment of an alignment system for monitoring alignment or overlay marks constructed according to aspects of the present disclosure.

FIG. 1 illustrates a schematic view of an alignment system 100 for monitoring alignment marks (or overlay marks) constructed according to aspects of the present disclosure in one or more embodiment. With reference to FIG. 1, the system 100 and the method to utilize the same to check alignment marks are collectively described.

The alignment system 100 includes a tunable light source 110 to provide tunable light beams. In one embodiment, the tunable light source 110 is a light source to provide a tunable light beam suitable for alignment measurement. Particularly, the tunable light source 110 is operable to generate light beams with different wavelengths to achieve multi-wavelength alignment measurement. The alignment system 100 is designed to perform alignment measurements using light beams of multi-wavelengths. Furthermore, the alignment system 110 has a simplified structure and configuration to achieve multi-wavelength alignment measurement by using the tunable light source.

The tunable light source 100 is operable to generate light beams with different wavelengths suitable for respective alignment measurements. In one embodiment, the light beams generated by the tunable light source 110 include visual light, infrared light, near-infrared (NIR) light, far-infrared (FIR) light, violet light, ultra-violet (UV) light or combinations thereof. In the present embodiment, the tunable light source 110 is operable to generate a red light, a green light, a NIR light and a FIR light, or a subset thereof. In a particular embodiment, the tunable light source 110 is operable to generate a red light with a first wavelength of about 633 nm, a green light with a second wavelength of about 532 nm, a NIR light with a third wavelength of about 780 nm, a FIR light with a fourth wavelength of about 850 nm or a subset thereof.

In various embodiments, the tunable light source 100 is a solid state laser source, a dye laser source, or other suitable laser source with a tunable wavelength in a desired range.

The tunable light source 100 may be designed with a proper mechanism of tuning the wavelength, such as grating distributed Bragg reflector, optical cavity with a microelectromechanical system (MEMS) to tune the cavity length or other suitable mechanism. In one example, the tunable light source 100 includes a tunable dye source with a tuning range between 420 nm and about 900 nm.

The alignment system 100 may include a mechanism 112 operable to direct a light beam from the tunable light source 110 to a wafer 114 positioned on a wafer stage 116. In one embodiment, the wafer stage 116 is operable to move such that the light beam is directed to various alignment marks of the wafer 114. In one embodiment, an alignment mark is a diffraction-based mark that utilizes a diffraction-based measurement. Particularly, the diffraction-based mark includes a periodic pattern, such as a grating pattern.

In another embodiment, the mechanism 112 is operable to direct the light beam to various alignment marks of the wafer 114. The wafer 114 includes a mark region 118 having a plurality of alignment marks stacked in the same region, such as a cell area or a scribe-line region. In one example, the alignment marks are configured and designed for monitoring the alignment between the wafer and a photomask. Alternatively, those marks are configured and designed for monitoring the overlay errors between different pattern layers formed on and to be formed on the wafer 114. In one embodiment, the wafer 114 includes multiple mark regions 118 located at different locations, such as scribe-line regions and/or various cell areas.

Each of the multiple mark regions includes a plurality of marks stacked in the respective region. In one example, the plurality of marks stacked in one region are overlay masks for monitoring the overlay error between one material layer of the wafer and a patterned photoresist layer formed on the wafer. If the overlay error is greater than an acceptable range, then a rework process may be initiated to remove the patterned photoresist layer and form another patterned photoresist layer.

The system 100 further includes a light detector 120 to receive a mark signal (that is a diffracted light pattern in the present embodiment) reflected from the wafer 114. The diffracted light signal is used to determine the alignment error or overlay error. In one embodiment, the detector 120 is designed to be operable to move and receive the intended diffracted light signal reflected from the wafer 114.

The system 100 may further include other components. In one example, the system 100 includes an alignment control unit designed to control the alignment based on the alignment error determined by alignment measurement. In another example, the system 100 further includes analysis module to analyze the alignment signal to determine the alignment error.

Figure 2:
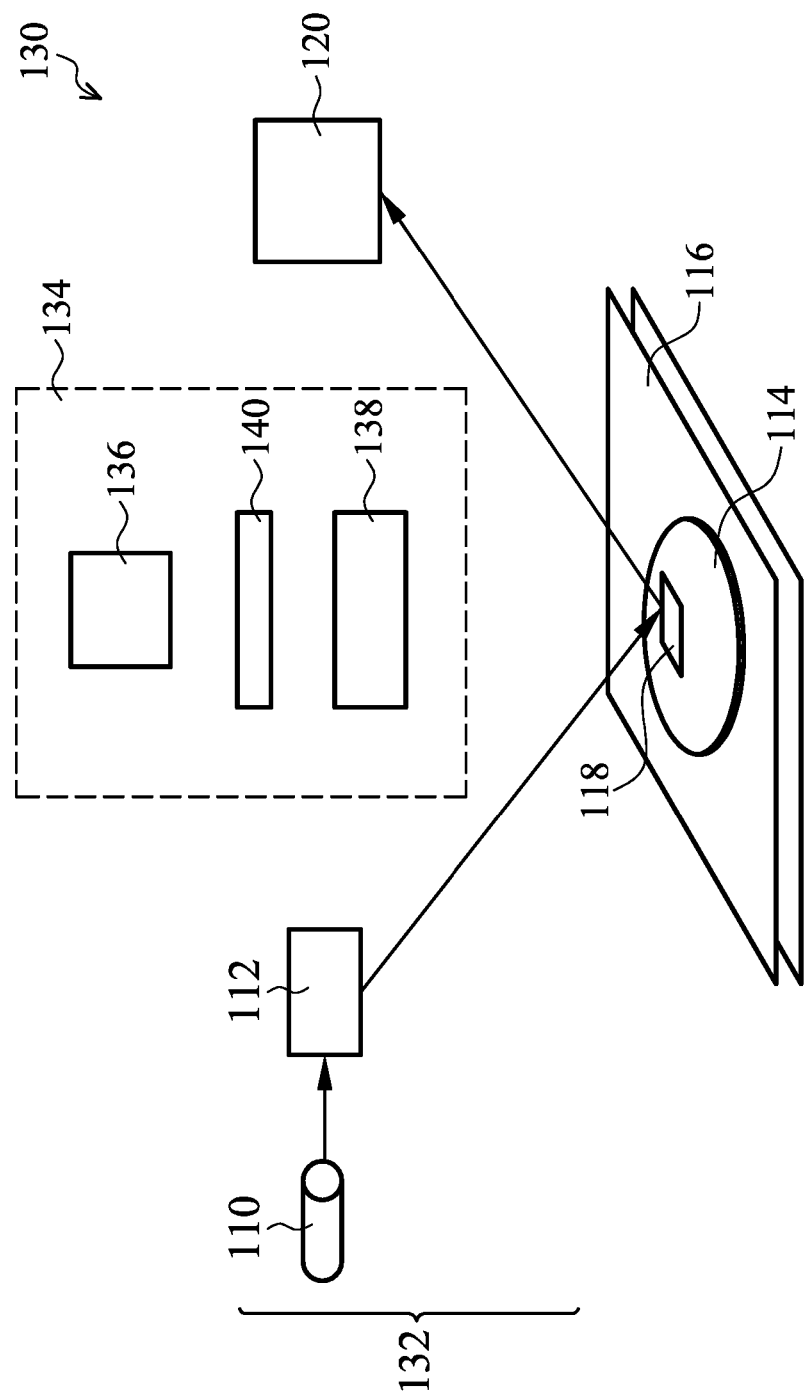
FIG. 2 is a schematic view of one embodiment of a lithography system that includes an exposing module and an alignment module constructed according to aspects of the present disclosure.

FIG. 2 is a schematic view of a lithography system 130 constructed according to various aspects of the present disclosure in one or more embodiment. The lithography system 130 includes a wafer stage 116 that is designed to secure a wafer 114. The wafer stage 116 is further configured for proper alignment measurement and an exposing process to pattern a photoresist layer coated on the wafer 114. The lithography system 130 includes an alignment module 132, such as one similar to the alignment system 100 of FIG. 1, used for overlay or alignment monitoring and measurement. For example, the alignment module 132 includes the tunable light source 110, the mechanism 112 and the light detector 120 configured to direct the light from the tunable light source 110 to the wafer 114 positioned on the wafer stage 116. The lithography system 130 also includes an exposing module (or an exposure module) 134 integrated with the alignment module 132 and designed for performing a lithography exposure process to a photoresist layer coated on the wafer 114. When the exposed photoresist layer is further developed, various openings are formed in the photoresist layer, which results in a patterned photoresist layer.

The exposing module 134 includes various components configured and integrated to perform an exposing process. The exposing module 134 is further described below. In the present embodiment, the exposing module 134 includes a radiation source (or source) 136 to provide radiation energy. The radiation source 136 may be any suitable light source. In various examples, the radiation source 136 may include a light source selected from the group consisting of ultraviolet (UV) source, deep UV (DUV) source, extreme UV (EUV) source, and X-ray source. For example, the radiation source 136 may be a mercury lamp having a wavelength of 436 nm (G-line) or 365 nm (I-line); a Krypton Fluoride (KrF) excimer laser with wavelength of 248 nm; an Argon Fluoride (ArF) excimer laser with a wavelength of 193 nm; a Fluoride ($F_2$) excimer laser with a wavelength of 157 nm; or other light sources having a desired wavelength (e.g., below approximately 100 nm). In another example, the light source is an EUV source having a wavelength of about 13.5 nm or less.

The exposing module 234 also includes an optical subsystem 138 that receives the radiation energy from the radiation source 136, modulates the radiation energy by the image of a photomask and directs the radiation energy to a resist layer coated on the wafer 114. In one embodiment, the optical subsystem 138 is designed to have a refractive mechanism. In this situation, the optical subsystem includes various refractive components, such as lenses. In another embodiment where the radiation energy is EUV energy, the optical subsystem is designed to have a reflective mechanism. In this situation, the optical subsystem includes various reflective components, such as mirrors.

In an embodiment, the optical subsystem 138 includes an illumination unit (e.g., a condenser). The illumination unit may include a single lens or a lens module having multiple lenses and/or other lens components. For example, the illumination unit may include microlens arrays, shadow masks, and/or other structures designed to aid in directing radiation energy from the radiation source 136 onto a photomask (also referred to as reticle or mask) 140. The photomask 140 is secured on a photomask stage of the exposing module 134 by a clamping mechanism, such as vacuum clamping or e-chuck clamping.

The optical subsystem 138 includes a projection unit. The projection unit may have a single lens element or a plurality of lens elements configured to provide proper illumination to the resist layer on the wafer 14. The optical subsystem 138 may further include additional components such as an entrance pupil and an exit pupil to form an image of the photomask 140 on the wafer 114. In another embodiment, the optical subsystem 138 may alternatively include various mirror components to provide a reflective mechanism of imaging.

During a lithography exposing process (or exposure process), the photomask 140 is positioned in the exposing module 134 such that an integrated circuit pattern defined thereon is imaged on the resist layer of the wafer 114. In one embodiment, the reticle 130 includes a transparent substrate and a patterned absorption layer. The transparent substrate may use fused silica ($SiO_2$) relatively free of defects, such as borosilicate glass and soda-lime glass. The transparent substrate may use calcium fluoride and/or other suitable materials. The patterned absorption layer may be formed using a plurality of processes and a plurality of materials, such as depositing a metal film made with chromium (Cr). A light beam may be partially or completely blocked when directed on an absorption region. The absorption layer may be patterned to have one or more openings through which a light beam may travel without being absorbed by the absorption layer. The photomask may incorporate other resolution enhancement techniques such as phase shift mask (PSM) and/or optical proximity correction (OPC).

In another embodiment where the radiation energy is EUV energy, the photomask is designed to have reflective mechanism. The photomask includes a substrate coated with a plurality of films to provide a reflective mechanism. For example, the photomask includes tens alternating layers of silicon and molybdenum deposited on a substrate to act as a Bragg reflector that maximizes the reflection of EUV light. In one embodiment, the photomask further includes an absorption layer, such as a tantalum boron nitride film, patterned to define a layout pattern of an integrated circuit. The photomask may further include a capping layer, such as ruthenium, to prevent oxidation.

The lithography system 130 may be designed differently according to different characteristics of the radiation source and other factors. In an alternative embodiment, the radiation source 136 is replaced by an electron source to provide electron beam (e-beam) for exposing the photoresist layer on the wafer by a proper mode, such as direct writing. In this case, the photomask 140 is eliminated during the exposing process. The integrated circuit pattern is defined in a database and is used for the direct writing during the exposing process. Additionally, the photoresist layer on the wafer 114 is replaced by a resist material sensitive to the electrons and the optical subsystem 138 is replaced by various suitable components with a mechanism (such as electromagnetic and/or electrostatic) to control the e-beam such that the integrated circuit pattern is written on the resist layer.

Figure 3:
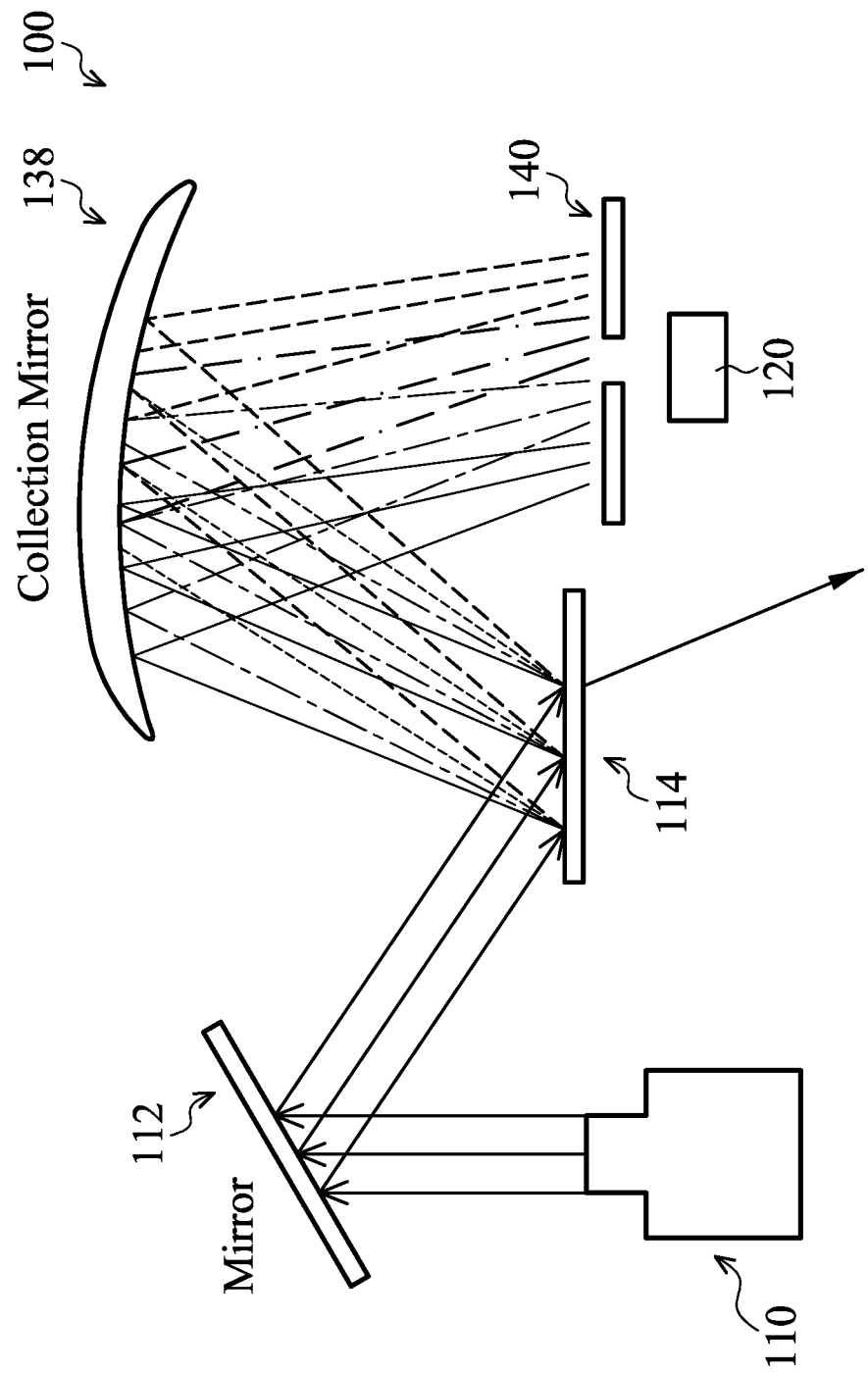
FIG. 3 is a schematic view of another embodiment of an alignment system for monitoring alignment or overlay marks constructed according to aspects of the present disclosure.

FIG. 3 is one embodiment of a schematic view of the alignment system 100 in FIG. 1 (or the alignment module 132 in FIG. 2). The alignment system 100 includes the tunable light source 110 and the detector 120 configured to provide a light signal and receive the light signal. The alignment system 100 includes the mechanism 112 to direct the light signal to the wafer 114. In the present example, the mechanism 112 includes a mirror. The alignment system 100 further includes a structure 138 to direct the light signal from the wafer 114 to the detector 120. In the present example, the structure 138 includes a mirror designed to effectively collect the light signal from the wafer 114 and configured to direct the light signal to the wafer 114. Therefore, the mirror in the structure 138 is also referred to as a collection mirror. The alignment system 100 may also include an aperture feature 140 having an opening designed such that a portion of the light signal from the collection mirror 138 is received by the detector 120. By using the aperture feature 140, the light signal from the wafer 114 can be selectively chosen for alignment or overlay measurement.

Figure 4:
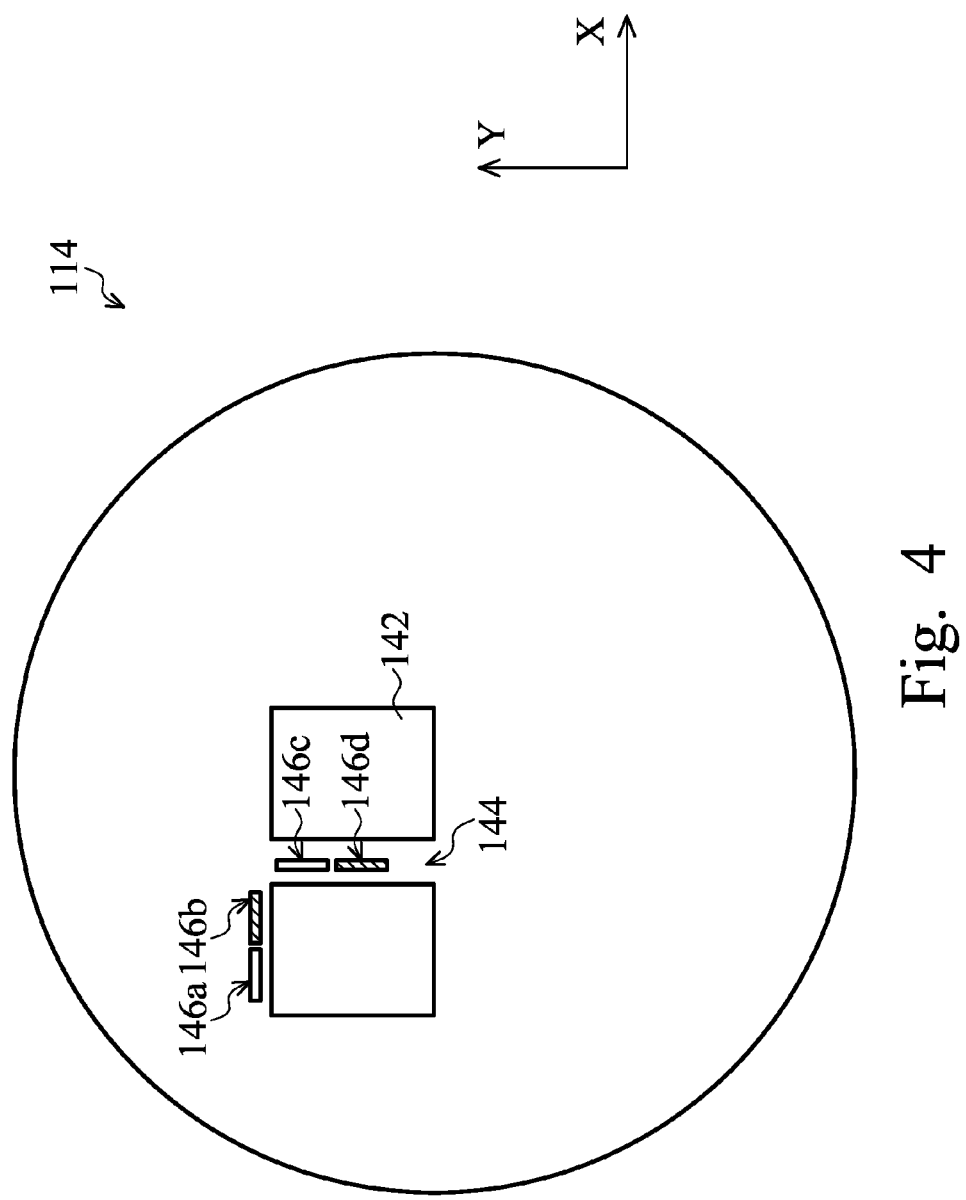
FIG. 4 is a top view of a semiconductor wafer having various marks constructed according to aspects of the present disclosure in one embodiment.

The wafer 114 is further described with a reference FIG. 4 in a top view. In the present embodiment, the wafer 114 is provided in the lithography system 130 for receiving an alignment measurement by the alignment module 132 and a lithography exposing process by the exposing module 134. In one embodiment, the wafer 114 includes a semiconductor substrate having an elementary semiconductor such as crystal silicon, polycrystalline silicon, amorphous silicon, germanium, and diamond, a compound semiconductor such as silicon carbide and gallium arsenic, an alloy semiconductor such as SiGe, GaAsP, AlInAs, AlGaAs, and GaInP, or a combination thereof. In furtherance of the present embodiment, a resist layer coated on the wafer 114 during the alignment measure and the lithography exposing process.

The wafer 114 includes a plurality of fields having integrated circuits defined therein for one or more dies. During a lithography exposing process, the wafer is exposed one field at a time. For example, the exposing module 134 scans the IC pattern defined in the reticle and transfers it to one field, then steps to next field and repeats the scanning until the fields in the wafer 114 are exhausted. Each field includes one or more circuit dies and a frame region at the boundary areas. FIG. 4 illustrates two exemplary dies (or chips) 142 and scribe lines 144 defined on the wafer 114. Each die 142 includes an integrated circuit. The scribe lines 144 are between the adjacent dis and define the area where the dies are separated by dicing. Various marks (alignment marks and/or overlay marks) 146 are defined in the scribe lines 144. Additionally or alternatively, the marks 146 maybe formed in the frame regions defined in the areas between the adjacent fields. In another embodiment, the marks 146 may also be formed in the circuit regions of the dies 142.

As one example illustrated in FIG. 4, the wafer 114 includes marks 146a through 146d disposed in different regions and oriented in different directions. Those marks 146 are designed to utilize the tunable light source 110 of the alignment system 110 (or the lithography system 130) for improved alignment measurement.

Figure 5:
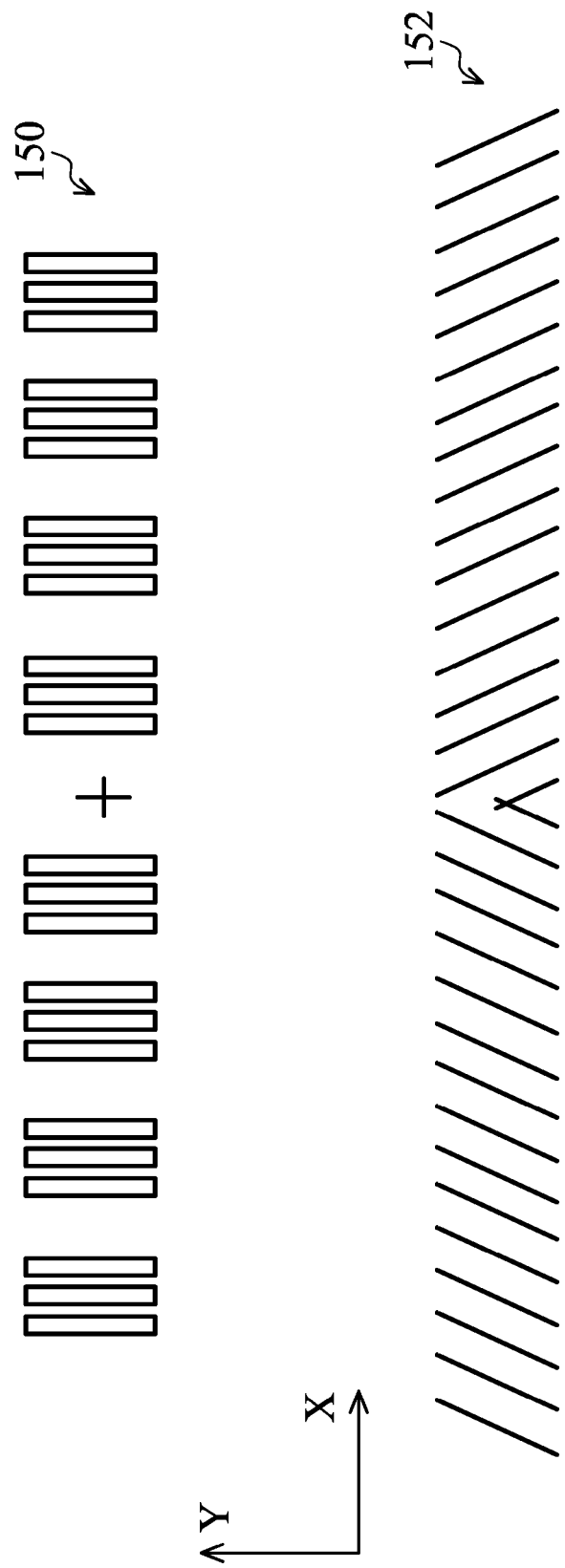
FIG. 5 is a top view of a mark configured according to aspects of the present disclosure in various embodiment.

The marks 146 are designed with a pattern for alignment and/or overlay measurements. For example, the marks 146 are designed to have a periodic structure, such as a grating structure, which are also referred to as diffraction-based marks. FIG. 5 illustrates two examples of the marks 146 in a top view. The mark 150 includes multiple features distributed in a first direction (X direction) and oriented in a second direction (Y direction) perpendicular to the first direction. The mark 152 includes multiple features distributed in the first direction. The mark 152 includes a first subset of features oriented in a third direction and a second subset of features oriented in a fourth direction. The third and fourth directions are not perpendicular to the first direction but are along tilted directions relative to the first and second directions. Those marks may be formed in different material layers of the wafer 114 for overlay measurement. For example, in FIG. 4, the marks 146a and 146c are formed in a first material layer and the marks 146b and 146s are formed in a second material layer overlying the first material layer. It is further described with reference to FIG. 6.

Figure 6:
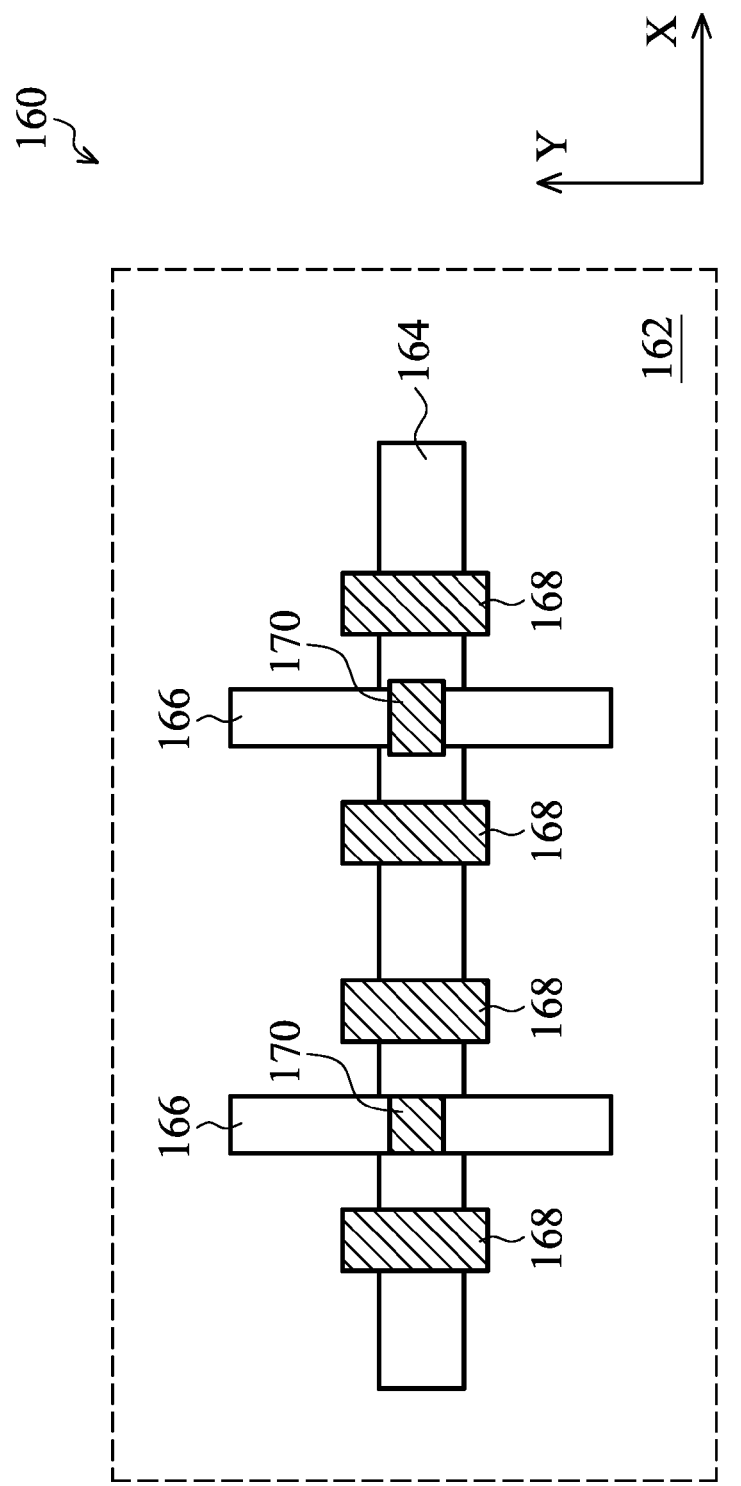
FIG. 6 is a top view of a semiconductor wafer having various circuit patterns constructed according to aspects of the present disclosure in one embodiment.

The FIG. 6 is a top view of one embodiment of a semiconductor structure 160 of the wafer 114, in portion. The semiconductor structure 160 includes two exemplary material layers disposed and patterned on the substrate 162 of the wafer 114. In the present example, the semiconductor structure 160 includes a plurality of active regions 164 includes one or more semiconductor material and defined in the substrate 162. In one example, the active regions 164 are formed by a procedure that includes etching a semiconductor substrate to form trenches, depositing a dielectric material to fill in the trenches and polishing to planarize the substrate surface. In the substrate 162, the regions other than the active regions 164 are dielectric features to provide isolations among the active regions 164. Those isolation features formed by the above procedure are also referred to as shallow trench isolation (STI) features.

The semiconductor structure 160 also includes various gates 166 formed on the substrate 162. The gates 166 include a conductive material patterned to form gate electrodes and further include a dielectric material to form gate dielectric that separates the gate electrodes from the substrate 162. The gates 166 are components for field-effect transistors (FETs). The semiconductor structure 160 further includes an interconnect structure having metal lines, contacts and vias configured to couple the FETs and other devices into a functional circuit. In the present example, the interconnect structure includes contacts 168 landing on source and drains and other contacts 170 landing on the gates. The sources and drains are components of the FETs. In this example for illustration, the semiconductor structure 160 includes various material layers patterned to form integrated circuit.

Further referring back to FIG. 4, the marks 146 on the wafer 114 include the marks 146*a* and 146*c* formed on the substrate and patterned with the active regions. The marks 146 on the wafer 114 also include the marks 146*b* and 146*d* formed on the gate layer and patterned with the gates. Especially, the mark 146*a* is extended in the X direction and the features in the mark 146*a* are oriented in the Y direction. The mark 146*a* is designed to monitor the misalignment or the overlay error in the X direction regarding the active regions. Similarly, the mark 146*c* is extended in the Y direction and the features in the mark 146*c* are oriented in the X direction. The mark 146*c* is designed to monitor the misalignment or the overlay error in the Y direction regarding the active regions. The mark 146*b* is extended in the X direction and the features in the mark 146*b* are oriented in the Y direction. The mark 146*b* is designed to monitor the misalignment or the overlay error in the X direction regarding the gates. Similarly, the mark 146*d* is extended in the Y direction and the features in the mark 146*d* are oriented in the X direction. The mark 146*d* is designed to monitor the misalignment or the overlay error in the Y direction regarding the gates.

Various contacts 168 and 170 are expected to be aligned with respective active regions 164 and gates 166. Particularly, the contacts 168 to the active regions 164 are more sensitive to the misalignment in the Y direction and the contacts 170 to the gates 166 are more sensitive to the misalignment in the X direction. When the alignment is measured during the process to for contacts, the alignments to the active regions 164 and the gates 166 are measured. However, the alignment errors to the marks 146*b* and 146*c* have more weights according to above reason. Accordingly, the alignment errors include a first alignment error to the alignment mark 146*b* and the second alignment error to the mark 146*c*.

In consideration of the circuit performance, different circuit features are more sensitive to respective directions. In this particular case, the circuit (or device) performance is more sensitive to the alignment of the active regions in the Y direction than in the X direction. The device performance is more sensitive to the alignment of the gates in the X direction than in the Y direction.

It is noticed that the wavelength of the light signal for the alignment measurement is sensitive to the pattern geometry, pattern topography and pattern dimensions of the marks 146. Accordingly, in the disclosed method to utilize the alignment system 100 for alignment measurements, the light signal of different wavelengths from the tunable light source 110 is applied to the different marks during the alignment measurements to have high quality signal, achieve high measurement quality and ultimately achieve high wafer quality. With considerations of both the wavelength sensitivity to the mark pattern and the sensitivity of the circuit pattern to certain direction, the wavelength of the tunable light source applied to the marks 146*a* and 146*c* associated with the active regions is tuned specific to the mark 146*c* such that the alignment measurement on the Y direction has more high measurement quality. The wavelength of the tunable light source applied to the marks 146*b* and 146*d* associated with the gates is tuned specific to the mark 146*b* such that the alignment measurement on the Y direction has more high measurement quality.

More specifically, for the marks 146*a* and 146*c* associated with the active regions 164, the wavelength is chosen according to the mark 146*c*. For the marks 146*b* and 146*d* associated with the gates 166, the wavelength is chosen according to the mark 146*b*.

Figure 7:
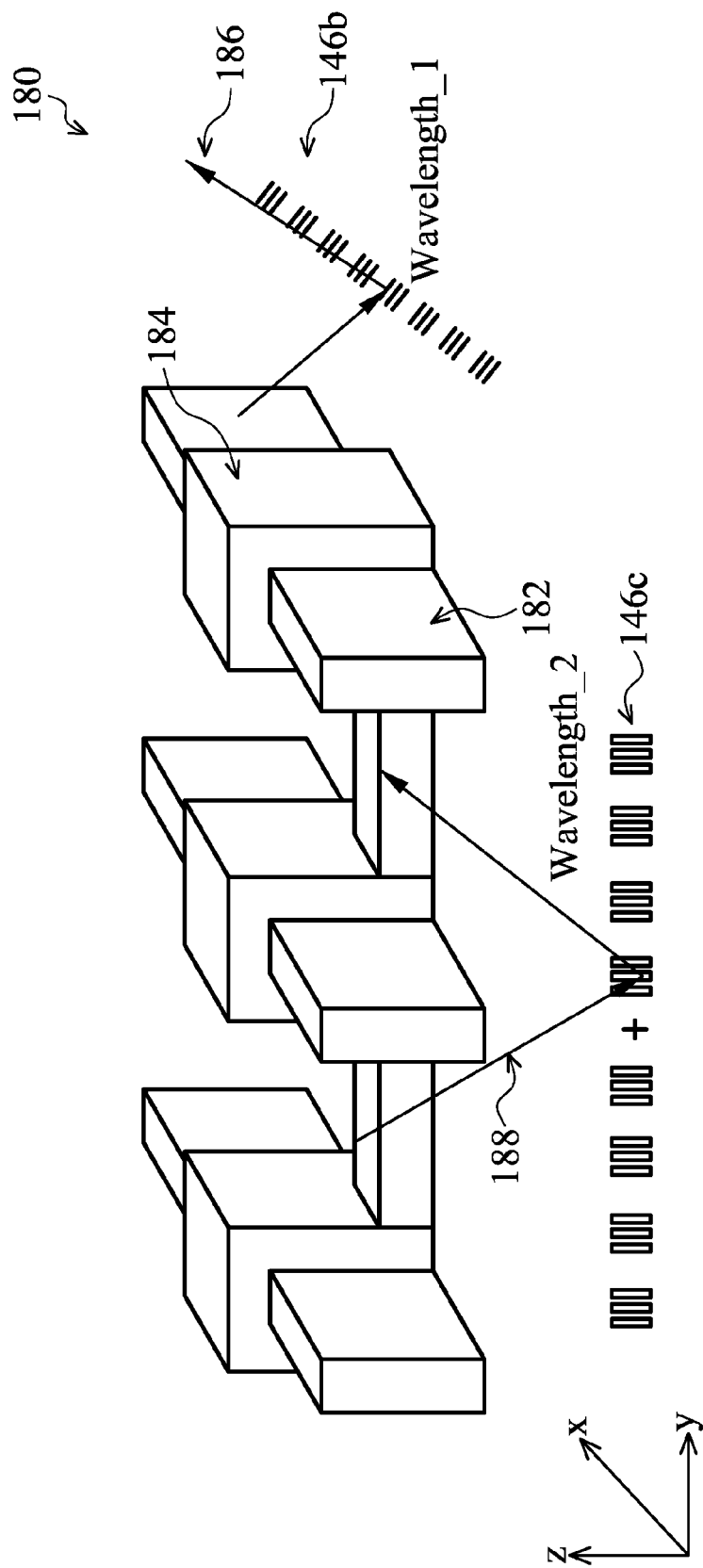
FIG. 7 is a schematic view of a semiconductor wafer having various circuit patterns constructed according to aspects of the present disclosure in another embodiment.

The above method for the alignment measurement with wavelength tuned specific to respective marks is further described with FIG. 7 below. FIG. 7 is a schematic view of a semiconductor structure 180 having three-dimensional transistors. In this particular example, the three-dimensional transistors are fin-like field-effect transistors (FinFETs) having active regions 182 and the gates 184. The active regions 182 are aligned in the X direction and the gates 184 are aligned in the Y direction. The Z direction is also labeled in FIG. 7 as a direction perpendicular to both the X and Y directions.

A mark 146*c* is also formed with the active region 182 in a same material layer. In various examples, the material layer for the active regions 182 and the mark 146*c* includes silicon, silicon germanium, or other suitable semiconductor material. The mark 146*c* is extended in the Y direction and the features in the mark 146*c* are oriented in the X direction. The mark 146*c* is designed to monitor the misalignment or the overlay error in the Y direction regarding the active regions. In one example, the mark 146*c* includes a mark pattern 150 in FIG. 5.

A mark 146*b* is also formed with the gates 184 in a same material layer, such as a polycrystalline silicon (polysilicon) material layer. In various examples, the material layer for the active regions 182 and the mark 146*c* includes polysilicon, metal, silicide and alloy or other suitable conductive material. The mark 146*b* is extended in the X direction and the features in the mark 146*b* are oriented in the Y direction. The mark 146*b* is designed to monitor the misalignment or the overlay error in the X direction regarding the gates. In one example, the mark 146*b* includes a mark pattern 152 in FIG. 5.

A light signal 186 of a first wavelength from the tunable light source is tuned specific to the mark 146*b* and is applied to the mark 146*b* by the alignment system 100 for alignment or overlay measurement of the material layer having the gates 184 defined therein while another light signal 188 of a second wavelength from the tunable light source is tuned specific to the mark 146*c* and is applied to the mark 146*c* by the alignment system 100 for alignment or overlay measurement of the material layer having the active regions 182 defined therein. Here the first and second wavelengths are tuned to corresponding marks for optimized signal quality or measurement quality. Thus, by applying the light signals of different wavelengths specific to individual marks, the alignment or overlay error in sensitive directions (such as the active regions 182 in the Y direction and the gates 184 in the X direction) are properly measured with optimized measurement quality and ultimately high wafer quality.

Figure 8:
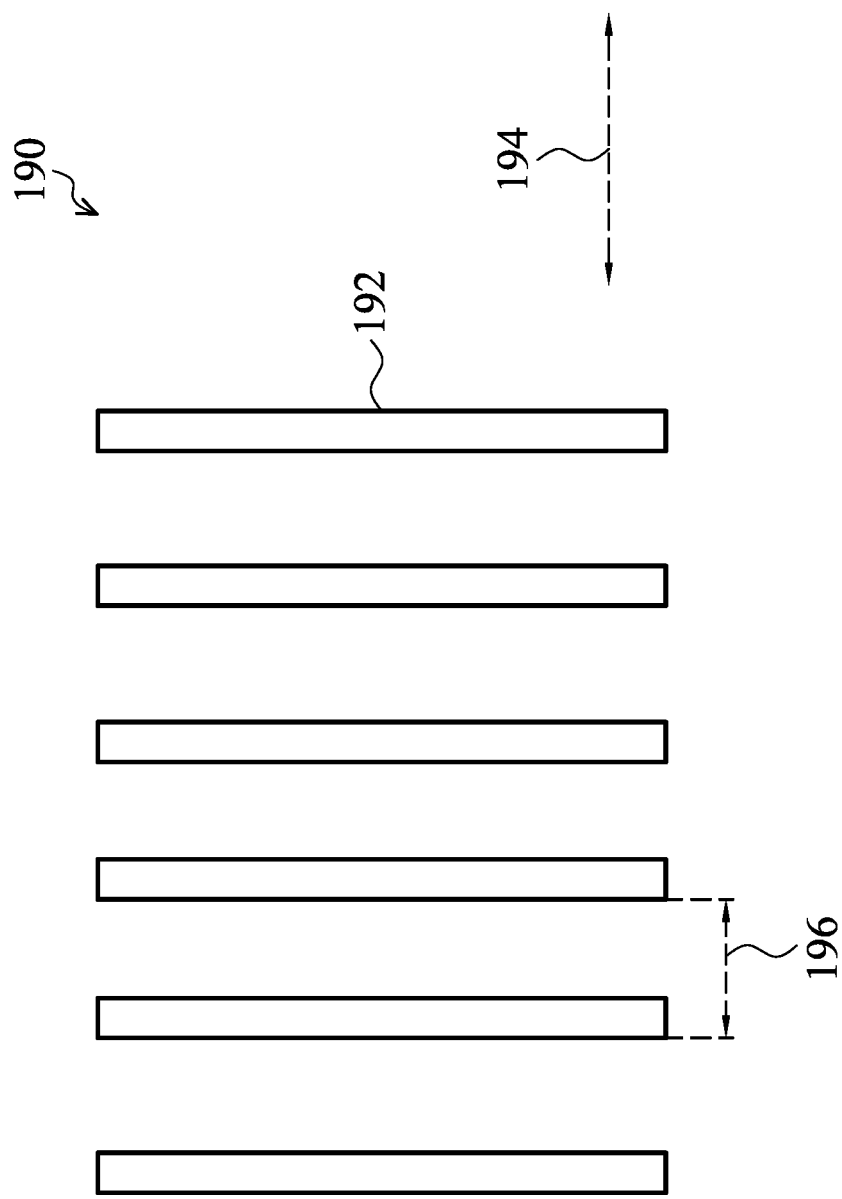
FIG. 8 is a top view of one embodiment of a diffraction-based mark configured according to aspects of the present disclosure.
Figure 9:
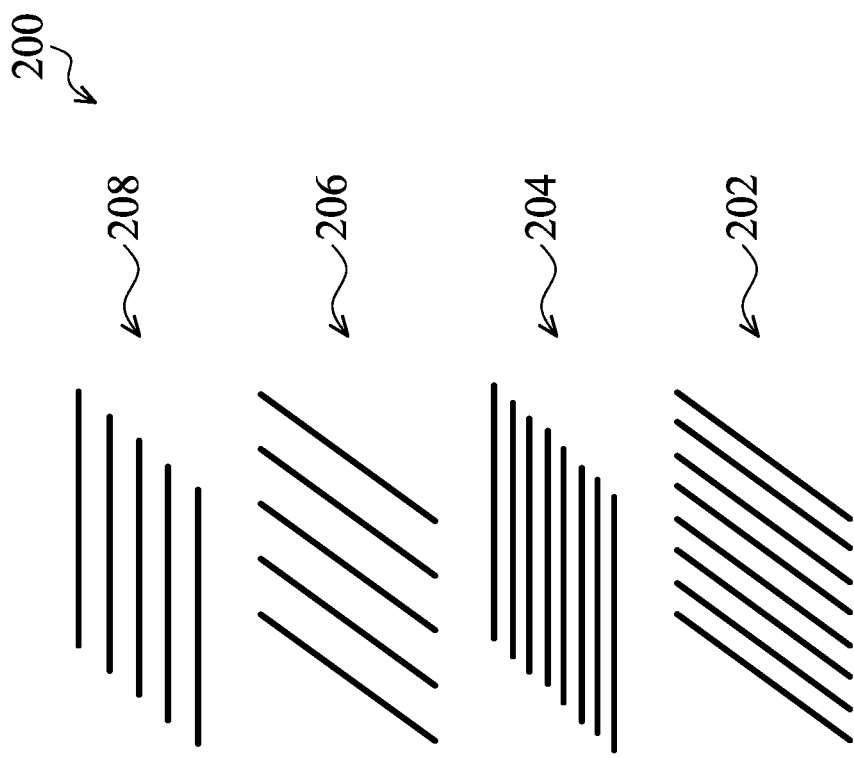
FIG. 9 is a schematic view of one embodiment of diffraction-based marks configured according to aspects of the present disclosure.
Figure 10:
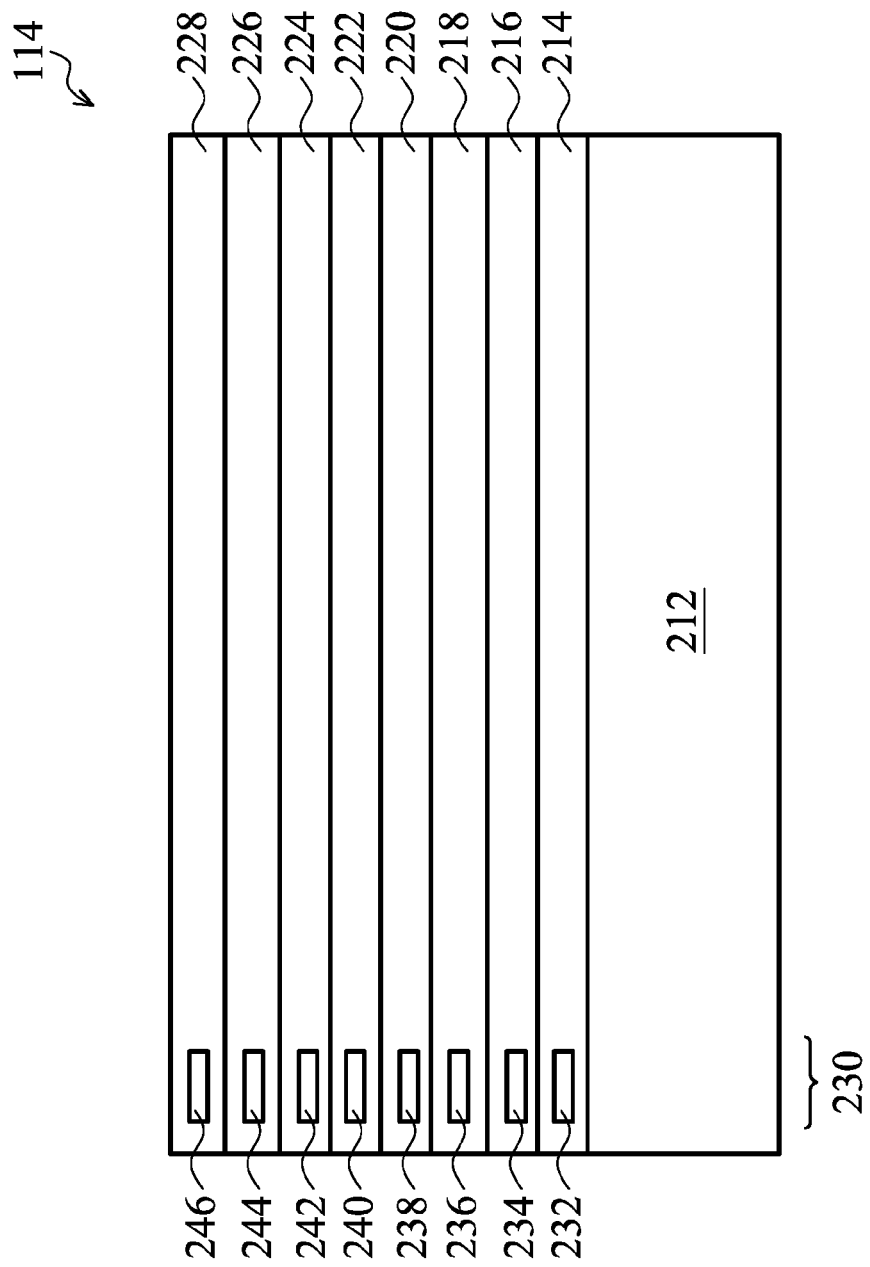
FIG. 10 is a sectional view of one embodiment of a wafer having marks configured according to aspects of the present disclosure.

In a more general example, more than two material layers are present a semiconductor wafer and each material layer includes a respective circuit pattern and a respective alignment (or overlay) mark. Those marks are designed to utilize the alignment system 100 for alignment measurement with the light signal of various wavelengths tuned to respective marks. FIG. 8 is a schematic view of a diffraction-based mark 190 formed in different material layers constructed according to one or more embodiments. FIG. 9 is a schematic view of diffraction-based marks 200 formed in different material layers constructed according one or more embodiments. The marks 200 may be stacked in a same area of the wafer 114. FIG. 10 is a sectional view of one embodiment of a wafer 114 having a plurality of alignment marks configured according to aspects of the present disclosure. The wafer 114, the mark 190 and the stacked marks 200 are collectively described with reference to FIGS. 8, 9 and 10.

The marks 190 each include a periodic structure capable of generating a diffraction signal by the incident light beam. The periodic structure defines a pitch as a constant of the periodic structure. In one embodiment, the mark 190 includes a grating structure having multiple lines configured in parallel and periodically. The lines 192 are positioned perpendicular to an orientation 194, referred to as the orientation of the grating. The grating also defines a pitch 196 measured from a location of a line to the same location of an adjacent line, as illustrated in FIG. 8. The pitch is comparable to the wavelength of the incident light beam for diffraction pattern. The lines and the gaps between lines have different absorption and/reflection to the incident light beam. For example, the lines are opaque and the gaps between the lines are transparent. The line width may be properly chosen for optimized diffraction signal. The mark 190 is only an example for illustration. Other periodic patterns capable of a reliable diffraction signal can be alternatively utilized. For example, the line pattern of the mark 190 can be further segmented to comply with the fabrication criteria or for signal improvement.

Further referring to FIG. 9, the diffraction-based marks 200 include a plurality of diffraction-based marks that may be stacked in the same region. Each one is similar to the mark 190 of FIG. 8. For example, each mark includes a grating structure with a pitch and an orientation. However, the diffraction-based marks 190 are designed to have various pitches and orientations. In this example, there are four material layers formed on a wafer. The first layer includes a first grating mark 202 having a first pitch and a first orientation. The second layer is overlying on the first layer and includes a second grating mark 204 having a second pitch and a second orientation. In this particular case, the second orientation is perpendicular to the first orientation. The third layer is overlying on the second layer and includes a third grating mark 206 having a third pitch and the first orientation. The fourth layer is overlying on the third layer and includes a fourth grating mark 208 having a fourth pitch and the second orientation. Therefore, as the marks 200 have various pitches and orientations, the alignment system 100 with the tunable light source 110 is used to apply alignment measurements to those marks. Especially, each mark is designed with a respective orientation corresponding to the more sensitive direction of the circuit pattern defined in that material layer. Furthermore, the light signal applied to each mark by the tunable light source 110 has the wavelength tuned to the corresponding mark such that the alignment signal output is intensive, is reliable and has high quality. Additionally, the wavelength may be further tuned based on the contrast and topography of the corresponding material layer.

In another embodiment illustrated in FIG. 10, the wafer 114 includes a substrate 212. Formed on the substrate 212 are eight exemplary material layers 214, 216, 218, 220, 222, 224, 226 and 228. In one example, the eight material layers are eight metal layers for interconnection. Each layer includes metal lines or vias/contacts. In another example, the eight material layers includes a first layer for active regions, a second layer for gates and other layers for contacts, vias and metal lines.

The eight layers 204-218 also include marks 232, 234, 236, 238, 240, 242, 244 and 246, each disposed in one respective layer and stacked in the region 230. Each of the marks can be simultaneously formed with the respective circuit pattern (metal features in this example) in the same material layer. Particularly, the first mark 232 in the first layer 214 and the second mark 234 in the second layer 216 have different pitches and different orientations.

Figure 11:
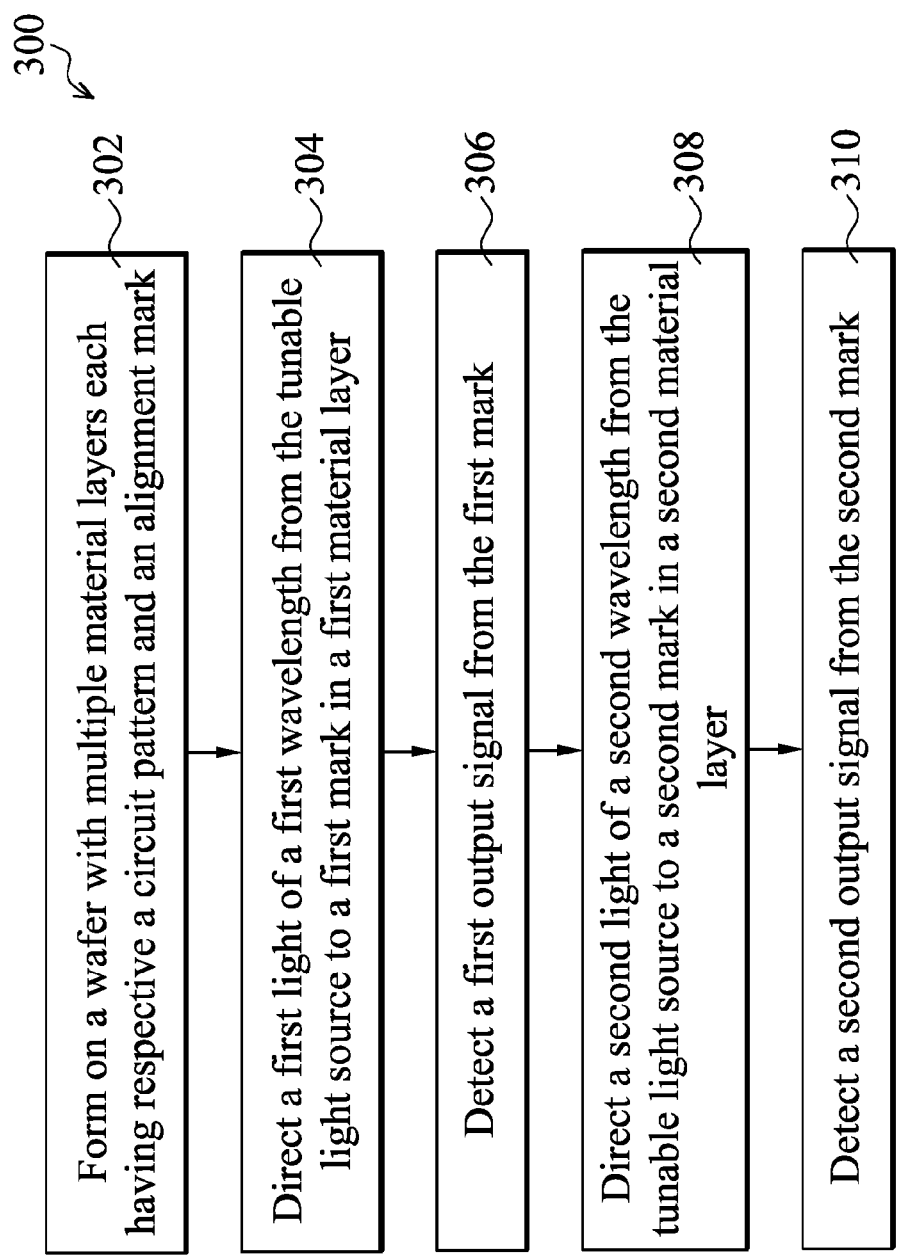
FIG. 11 is a flowchart of a method to utilize the alignment system of FIG. 1 and marks constructed according to various aspects of the present disclosure.

FIG. 11 provides a flowchart of a method 300 to utilize the alignment system 100 of FIG. 1 according to one or more embodiment of the present disclosure. With reference to FIGS. 1 through 11, the method 300 is described below. The method 300 begins at operation 302 by forming on a wafer 114 with multiple marks on the wafer 114 and designed with respective orientations. In one example, the wafer 114 includes a first material layer having a first circuit pattern and a first mark. Especially, the first material layer has its topography, contrast and other characteristics relevant to the light energy from the tunable light source 110. The wafer 114 also includes a second material layer disposed on the first material layer. The second material layer has a second circuit pattern and a second mark. Especially, the second material layer has its topography, contrast and other characteristics relevant to the light energy from the tunable light source 110.

In one embodiment, the wafer 114 further includes a third material layer on the second material layer. The third material layer is to be patterned. A resist layer is coated on the third material layer to be pattern by a lithography process. The third material layer is to be patterned by utilizing the patterned resist layer.

The method 300 proceeds to operation 304 by generating a first light (signal) of a first wavelength to the first mark. The first wavelength is chosen such that the output signal from the first mark has high or optimized signal quality. In one example, the signal quality is measured by the signal intensity and signal to background noise. In one embodiment, the first wavelength is chosen according to the topography and contrast of the first mark. In another embodiment, the first wavelength is chosen additionally or alternatively according to the pattern (such as pitch) of the first mark. During the operation 304, the tunable light source 110 is tuned over various wavelengths to evaluate the signal quality. The wavelength corresponding to or close to the best wavelength is determined as the first wavelength. In one embodiment, before applying the first light, the tunable light source 110 is tuned to the first wavelength. The first light is generated and directed to the first mark.

The method 300 proceeds to operation 306 by detecting a first output signal from the first mark by the detector 120. The alignment system 100 may further include a signal analysis module integrated in or alternatively coupled with. The signal analysis module is further used to analyze the first output signal for alignment or overly error.

The method 300 proceeds to operation 308 by generating a second light (signal) of a second wavelength to the second mark. The second wavelength is chosen such that the output signal from the second mark has high or optimized signal quality. In one embodiment, the second wavelength is chosen according to the topography and contrast of the second mark. In another embodiment, the second wavelength is chosen additionally or alternatively according to the pattern (such as pitch) of the second mark. During the operation 308, the tunable light source 110 is tuned over various wavelengths to evaluate the signal quality. The wavelength corresponding to or close to the best wavelength is determined as the second wavelength. In one embodiment, before applying the second light, the tunable light source 110 is tuned to the second wavelength. The second light is generated and directed to the second mark.

The method 300 proceeds to operation 310 by detecting a second output signal from the second by the detector 120. The signal analysis module is further used to analyze the second output signal for alignment or overly error.

Other operations may be implemented before, during and after the method 300. In one example, the method 300 may further proceed to other operations similar to operations 304 and 306 but be applied to other marks in respective material layers. As another example when the marks are used as overlay marks, if the overlay error is out of specification, the patterned photoresist layer may be reworked by a procedure that includes stripping, coating, exposing and developing. In another example, the marks are used as alignment marks. The alignment control unit of the lithography system 130 will automatically adjust alignment between the wafer and a photomask until the alignment errors are minimized or within the specification. In this case, the alignment errors include alignment errors to various material layers. As an example illustrated in FIG. 6, the third material layer is contact layer, the first and second material layers are active regions and gates, respectively. When the alignment is used to align the photomask for contact patterning, the alignment errors includes a first alignment error to the active regions 164 and the second alignment error to the gates 166. The alignment is adjusted such that the collective alignment errors are minimized.

In another embodiment, double or multiple patterning is used to pattern a material layer to enhance the resolution. In this case, two or more patterns are formed in the same material layer, respective marks are formed in different pattern layers in the same material layer. In this case, the above method still applicable to various pattern layers and marks associated with respective pattern layers. For example, the marks 146 in FIG. 4 may represent marks in different pattern layers. The marks 146a and 146c are marks in a first pattern (layer). The marks 146b and 146d are marks in a second pattern (layer). Both patterns are defined in the same material layer by a double patterning process or a multiple patterning process.

By using the tunable light source 110, the alignment system 100 is more effectively to tune the wavelengths specific to various marks according to mark pattern, mark contrast, mark topography and sensitive orientation of the pattern.

The present disclosure provides one embodiment of a lithography system for integrated circuit making. The system includes a substrate stage designed to secure a substrate and being operable to move the substrate; an alignment module that includes a tunable light source being operable to generate an infrared light with a wavelength tunable; and a detector to receive the light; and an exposing module integrated with the alignment module and designed to performing an exposing process to a resist layer coated on the substrate.

The present disclosure also provides one embodiment of an alignment system for integrated circuit making. The system includes a substrate stage designed to secure a substrate and being operable to move the substrate; a tunable light source being operable to generate an infrared light with a wavelength tunable; a detector configured to receive an output signal that is the light reflected from the substrate; and an exposing module integrated with the alignment module and designed to performing an exposing process to a resist layer coated on the substrate.

The present disclosure also provides one embodiment of a method for integrated circuit fabrication. The method includes providing an integrated circuit (IC) substrate having a first alignment mark defined in a first pattern layer and a second alignment mark defined in a second pattern layer; illuminating the first alignment mark with a first light of a first wavelength in near-infrared (NIR) from a tunable light source for alignment monitoring of the first alignment mark; and illuminating the second alignment mark with a second light of a second wavelength in far-infrared (FIR) from the tunable light source for alignment monitoring of the second alignment mark.

The present disclosure has been described relative to a preferred embodiment. Improvements or modifications that become apparent to persons of ordinary skill in the art only after reading this disclosure are deemed within the spirit and scope of the application. It is understood that several modifications, changes and substitutions are intended in the foregoing disclosure and in some instances some features of the invention will be employed without a corresponding use of other features. Accordingly, it is appropriate that the appended claims be construed broadly and in a manner consistent with the scope of the invention.

What is claimed is:

1. A method, comprising:
providing an integrated circuit (IC) substrate having a first alignment mark and a second alignment mark defined in a first pattern layer, and having a third alignment mark and a fourth alignment mark defined in a second pattern layer;
illuminating the first and second alignment marks, through a photomask, with a first light to determine a first layer alignment error including a first alignment error in relation to the first alignment mark and a second alignment error in relation to the second alignment mark, wherein the first alignment error has more weight than the second alignment error in determining the first layer alignment error; and
illuminating the third and fourth alignment marks, through the photomask, with a second light to determine a second layer alignment error including a third alignment error in relation to the third alignment mark and a fourth alignment error in relation to the fourth alignment mark, wherein the third alignment error has more weight than the fourth alignment error in determining the second layer alignment error.

2. The method of claim 1, further comprising tuning a first wavelength of the first light according to pattern topography and pattern contrast of the first alignment mark before the illuminating of the first alignment mark.

3. The method of claim 1, further comprising:
tuning a first wavelength of the first light based on contrast and topography of a first circuit pattern defined in the first pattern layer; and
tuning a second wavelength of the second light based on contrast and topography of a second circuit pattern defined in the second pattern layer.

4. The method of claim 1, further comprising:
determining a collective alignment error including the first layer alignment error and the second layer alignment error; and
adjusting alignment between the IC substrate and the photomask to minimize the collective alignment error.

5. The method of claim 4, further comprising:
depositing a third layer over the first pattern layer and the second pattern layer;
forming a sensitive resist layer over the third layer; and
after adjusting alignment between the IC substrate and the photomask, patterning the third layer to form a third circuit pattern using the photomask.

6. The method of claim 5, wherein the adjusting alignment between the IC substrate and the photomask comprises:
adjusting alignment between the IC substrate and the photomask to align a first set of contacts defined by the third circuit pattern with active regions defined by a first circuit pattern and to align a second set of contacts defined by the third circuit pattern with gates defined by a second circuit pattern.

7. The method of claim 1, wherein the first alignment mark is designed to monitor alignment in a first direction, and wherein the second alignment mark is designed to monitor alignment in a second direction perpendicular to the first direction.

8. A method, comprising:
providing an integrated circuit (IC) substrate including a first layer having a first alignment mark and a second alignment mark;
providing a second layer disposed over the first layer, wherein the second layer includes a third alignment mark and a fourth alignment mark;
performing a first alignment measurement by illuminating the first alignment mark and the second alignment mark, through a photomask, using a first light to generate a first output signal from the first alignment mark and a second output signal from the second alignment mark, wherein the first output signal has higher quality than the second output signal; and
performing a second alignment measurement by illuminating the third alignment mark and the fourth alignment mark, through the photomask, using a second light to generate a third output signal from the third alignment mark and a fourth output signal from the fourth alignment mark, wherein the third output signal has higher quality than the fourth output signal; and
adjusting alignment between the IC substrate and the photomask based on at least one of the first, second, third, and fourth output signals.

9. The method of claim 8, further comprising:
tuning a first wavelength of the first light from a tunable light source according to the first alignment mark before the performing the first alignment measurement; and
tuning a second wavelength of the second light from the tunable light source according to the third alignment mark before the performing the second alignment measurement.

10. The method of claim 9, further comprising:
depositing a third layer over the first layer and the second layer;
forming a sensitive resist layer over the third layer; and
after the adjusting alignment between the IC substrate and the photomask, patterning the third layer to form a third circuit pattern using the photomask.

11. The method of claim 10, wherein the first alignment mark is extended in a first direction and the second alignment mark is extended in a second direction;
wherein a first circuit pattern of the first layer includes active regions aligned in the first direction;
wherein the third alignment mark is extended in a third direction and the fourth alignment mark is extended in a fourth direction;
wherein a second circuit pattern of the second layer includes gates aligned in the third direction; and
wherein the adjusting alignment between the IC substrate and the photomask further comprises:
adjusting alignment between the IC substrate and the photomask to align a first set of contacts defined by the third circuit pattern with the active regions of the first circuit pattern and to align a second set of contacts defined by the third circuit pattern with the gates of the second circuit pattern.

12. The method of claim 11, further comprising: using the first circuit pattern and the second circuit pattern to form fin-like field-effect transistors (FinFETs) having the active regions and the gates.

13. The method of claim 11, wherein the second direction is perpendicular to the first direction, and the fourth direction is perpendicular to the third direction.

14. The method of claim 9, wherein the tunable light source is designed with a mechanism of tuning the first wavelength of the first light and the second wavelength of the second light, wherein the mechanism includes one of grating distributed Bragg reflector and optical cavity with a microelectromechanical system (MEMS) to tune a cavity length.

15. A method, comprising:
patterning a first layer over an integrated circuit (IC) substrate to form a first alignment mark and a second alignment mark;
forming a second layer over the first layer;
patterning the second layer to form a third alignment mark and a fourth alignment mark;
illuminating the first and second alignment marks, through a photomask, with a first light, to determine a first alignment mark error in relation to the first alignment mark and a second alignment mark error in relation to the second alignment mark, wherein the first alignment mark error has more weight than the second alignment mark error in determining a first layer alignment error;
illuminating the third and fourth alignment marks, through the photomask, with a second light, to determine a third alignment mark error in relation to the third alignment mark and a fourth alignment mark error in relation to the fourth alignment mark, wherein the third alignment mark error has more weight than the fourth alignment mark error in determining a second layer alignment error; and
adjusting alignment between the IC substrate and the photomask based on the first layer alignment error and the second layer alignment error.

16. The method of claim 15, further comprising:
tuning a first wavelength of the first light from a tunable light source according to the first alignment mark; and
tuning a second wavelength of the second light from the tunable light source according to the third alignment mark.

17. The method of claim 16, further comprising:
depositing a third layer over the second layer;
forming a sensitive resist layer over the third layer; and
after the adjusting alignment between the IC substrate and the photomask, performing an exposing process, using the photomask, to the sensitive resist layer to form a third circuit pattern in the third layer.

18. The method of claim 17, wherein a first circuit pattern of the first layer includes active regions aligned in a first direction;

wherein a second circuit pattern of the second layer includes gates aligned in a second direction; and wherein the adjusting alignment between the IC substrate and the photomask further comprises:

adjusting alignment between the IC substrate and the photomask to align a first set of contacts defined by the third circuit pattern with the active regions of the first circuit pattern and to align a second set of contacts defined by the third circuit pattern with the gates of the second circuit pattern.

19. The method of claim 18, wherein the first alignment mark includes multiple features distributed in the first direction, wherein each feature is oriented in a direction perpendicular to the first direction.

20. The method of claim 15, further comprising:

prior to the illuminating the first and second alignment marks, providing the first light with a wavelength of about 780 nm; and prior to the illuminating the third and fourth alignment marks, providing the second light with a wavelength of about 850 nm.

* * * * *